(12) United States Patent
Bousquet et al.

(10) Patent No.: US 7,629,237 B2
(45) Date of Patent: Dec. 8, 2009

(54) MBE GROWTH OF A SEMICONDUCTOR LAYER STRUCTURE

(75) Inventors: Valerie Bousquet, Oxford (GB); Stewart Edward Hooper, Kidlington (GB); Jennifer Mary Barnes, Headington (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 395 days.

(21) Appl. No.: 10/525,499

(22) PCT Filed: Aug. 18, 2003

(86) PCT No.: PCT/JP03/10420

§ 371 (c)(1),
(2), (4) Date: Sep. 21, 2005

(87) PCT Pub. No.: WO2004/019392

PCT Pub. Date: Mar. 4, 2004

(65) Prior Publication Data

US 2006/0128122 A1    Jun. 15, 2006

(30) Foreign Application Priority Data

Aug. 23, 2002    (GB)    ................................ 0219729.1

(51) Int. Cl.
  *H01L 21/36*    (2006.01)
  *H01L 21/20*    (2006.01)
(52) U.S. Cl. ................... 438/493; 257/E21.097; 257/E21.109; 438/478; 438/488
(58) Field of Classification Search .......... 257/E21.097, 257/E21.109
See application file for complete search history.

(56) References Cited

U.S. PATENT DOCUMENTS 5,602,418 A    2/1997    Imai et al.
5,740,192 A *  4/1998    Hatano et al. ............ 372/45.01

(Continued)

FOREIGN PATENT DOCUMENTS

EP    1 061 564 A2    12/2000

(Continued)

OTHER PUBLICATIONS

Damilano, Appl. Phys. Lett., vol. 77(9), p. 1268 (2000).*

(Continued)

*Primary Examiner*—Asok K Sarkar
(74) *Attorney, Agent, or Firm*—Harness, Dickey & Pierce, P.L.C.

(57) ABSTRACT

A method of MBE growth of a semiconductor layer structure comprises growing a first (Al,Ga)N layer (step 13) over a substrate at the first substrate temperature (T1) using ammonia as the nitrogen precursor. The substrate is then cooled (step 14) to a second-substrate temperature (T2) which is lower than the first substrate temperature. An (In,Ga)N quantum well structure is then grown (step 15) over the first (Al, Ga)N layer by MBE using ammonia as the nitrogen precursor. The supply of ammonia to the substrate is maintained continuously during the first growth step, the cooling step, and the second growth step. After completion of the growth of the (In,Ga)N quantum well structure, the substrate may be heated to a third temperature (T3) which is greater than the second substrate temperature (T2). A second (Al,Ga)N layer is then grown over the (In,Ga)N quantum well structure (step 17).

4 Claims, 4 Drawing Sheets

U.S. PATENT DOCUMENTS 6,534,801 B2    3/2003    Yoshida

FOREIGN PATENT DOCUMENTS

| | | |
|---|---|---|
| EP | 1 164 210 A2 | 12/2001 |
| JP | 2001-102675 | 4/2001 |
| JP | 2002-184972 | 6/2002 |

OTHER PUBLICATIONS

Shuji Nakamura et al., "Candela-class high-brightness InGaN/AlGaN double-heterostructure blue-light-emitting diodes", Applied Physics Letters, American Institute of Physics, New York, US, vol. 64, No. 13, Mar. 28, 1994, pp. 1687-1689.

Shuji Nakamura et al., "Superbright Green InGaN Single-Quantum-Well-Structure Light-Emitting Diodes", Japanese Journal of Applied Physics, Publication Office Japanese Journal of Applied Physics, Tokyo, Japan, vol. 34, No. 10B, Part 2, Oct. 15, 1995, pp. L1332-L1335.

Japanese Office Action dated Jul. 10, 2009.

Seikoh Yoshida, "*Photoluminescence measurement of InGaN and GaN grown by a gas-source molecular-beam epitaxy method*", J. Appl. Phys., vol. 81, No. 12, pp. 7966-7969 (1997).

N. Grandjeen, et al., "*Real time control of $In_xGa_{1-x}N$ molecular beam epitaxy growth*", Appl. Phys. Lett., vol. 72, No. 9, pp. 1078-1080 (1998).

Japanese Office Action dated Apr. 13, 2009.

* cited by examiner

MBE GROWTH OF A SEMICONDUCTOR LAYER STRUCTURE

TECHNICAL FIELD

This invention relates to a molecular beam epitaxy (MBE) method for the epitaxial growth of Group III nitride semiconductor materials. It particularly relates to the epitaxial growth of a semiconductor layer structure, for example a quantum well or multiple quantum well structure, comprising one or more $In_xGa_{1-x}N$ ($0 \leq x \leq 1$) layers. It also relates to the growth of a light-emitting diode containing one or more quantum wells.

BACKGROUND ART

The $In_xGa_{1-x}N$ ($0 \leq x \leq 1$) material family will be referred to herein as "(In,Ga)N" for convenience. The term "InGaN" will be used to denote a member of the (In,Ga)N family having an indium mole fraction that is non-zero, but that is less than one.

The term "AlGaN" is used to denote a member of the $Al_yGa_{1-y}N$ ($0 \leq y \leq 1$) material family having an aluminium mole fraction y that is non-zero but is less than 1. The complete material family, including y=0 and y=1, will be referred to herein as "(Al,Ga)N" for convenience.

The epitaxial growth of Group III nitride semiconductor materials on a substrate can be effected by molecular beam epitaxy (MBE) or by chemical vapour deposition (CVD) which is sometimes known as Vapour Phase Epitaxy (VPE).

CVD/VPE takes place in an apparatus which is commonly at atmospheric pressure but sometimes at a slightly reduced pressure of typically about 10 kPa. Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

In contrast to CVD/VPE, MBE is carried out in a high vacuum environment. In the case of MBE as applied to the (In,Ga)N system, an ultra-high vacuum (UHV) environment, typically around $1 \times 10^{-3}$ Pa, is used. A nitrogen precursor is supplied to the MBE chamber by means of a supply conduit and species providing gallium and/or indium, and if desired also a suitable dopant species, are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The nitrogen precursor and the species supplied from the effusion cells travel across the MBE chamber and reach the substrate where epitaxial growth takes place in a manner which is driven by the deposition kinetics.

At present, the majority of growth of high quality nitride semiconductor layers is carried out using the metal-organic vapour phase epitaxy (MOVPE) process. The MOVPE process allows growth to occur at a V/III ratio well in excess of 1000:1. The V/III ratio is the molar ratio of the group V element to the Group III element during the growth process. A high V/III ratio is preferable, since this allows a higher substrate temperature to be used which in turn leads to a higher quality semiconductor layer.

At present, growing high quality nitride semiconductor layers by MBE is more difficult than growing such layers by MOVPE. The principal difficulty is in supplying sufficient nitrogen during the growth process, and it is difficult to obtain a V/III ratio of 10:1 or greater during MBE growth of a nitride semiconductor layer. The two commonly used sources of nitrogen in the MBE growth of nitride layers are plasma excited molecular nitrogen or ammonia.

One particular application of InGaN layers is in the manufacture of light-emitting diodes ("LEDs") and laser diodes that emit light in the blue region of the spectrum. These are of use in many applications such as, for example, full-colour LED displays, full-colour photocopying machines or scanners, traffic lights and other devices requiring a full-colour light source. Light-emitting diodes and laser diodes that emit in the blue region of the spectrum can be fabricated using layer structures of group III-nitride semiconductors. (In, Ga)N quantum well structures are an essential component in the active region of these light-emitting diodes and laser diodes.

Acknowledgement of Prior Art

The (In,Ga)N quantum well structures in commercially available light-emitting diodes or laser diodes that emit in the blue region of the spectrum are grown using the MOVPE growth technique. There is extensive prior art relating to the MOVPE growth conditions, and to the electrical and optical properties of light-emitting diodes grown by MOVPE. The commercial growth of such laser diodes or light-emitting diodes by MOVPE has been reported by S. Nakamura et al in "Japanese Journal of Applied Physics" Vol. 34, pL1332 (1995), and by P. Kozodoy et al in "Gallium Nitride and Related Materials II Material Research Society, Symposium Proceedings" pp 481-486 (1997).

In contrast to MOVPE growth, there are only a few reports on the growth of InGaN-based LEDs by the MBE growth process using ammonia as the source of nitrogen.

M Mayer et al have reported, in "Journal of Crystal Growth" Vol. 201, p 318 (1999), the growth of nitride-based LEDs using MBE with ammonia as the nitrogen source. However, the structure grown in this report is a simple p:n junction, and does not contain an InGaN quantum well structure.

The growth of InGaN quantum well structures by MBE has been reported by H. Riechert et al in "Material Research Society Symposium Proceedings", Vol. 449, p 149 (1997) and by N. Grandjean et al in "Applied Physics Letters" Vol. 74 p 3616 (1999). However, in both cases the growth temperature was low, being in the range 570-620° C. A low growth temperature was obtained because the flux of ammonia to the growth chamber was low, leading to a low V/III ratio. As a consequence of the low growth temperature, the quality of the InGaN layers grown by these prior art MBE methods is much lower than the quality of InGaN layers grown by MOCVD.

U.S. Pat. No. 5,602,418 discloses a method of growing a multi-crystalline layer on a substrate, so as to allow a single crystal layer that is not lattice-matched to the substrate to be grown over the multi-crystalline layer. The method is described for a number of material systems, including the growth of an InGaN layer over an R-face sapphire substrate. It does not address the subsequent growth of further layers over the single crystal layer.

U.S. Pat. No. 5,684,309 disclose a method of growing AlGaN/InGaN or AlInGaN/InGaN semiconductor layer structures by MOCVD.

DISCLOSURE OF THE INVENTION

A first aspect of the present invention provides a method of growing a semiconductor layer structure, the method comprising the steps of:

growing a first (Al,Ga)N layer over a substrate at the first substrate temperature by MBE using ammonia as the nitrogen precursor;

cooling the substrate to a second substrate temperature lower than the first substrate temperature, while maintaining the supply of ammonia to the substrate;

growing an (In,Ga)N quantum well structure over the first (Al,Ga)N layer by MBE using ammonia as the nitrogen precursor;

heating the substrate to a third substrate temperature higher than the second substrate temperature, while maintaining the supply of ammonia to the substrate; and growing a second (Al,Ga)N layer over the quantum well structure at the third substrate temperature by MBE using ammonia as the nitrogen precursor.

The (In,Ga)N quantum well structure contains one or more (In,Ga)N layers. It may contain, for example, at least two adjacent (In,Ga)N layers having different indium mole fractions.

The first (Al, Ga)N layer may have a first conductivity type. The second (Al,Ga)N layer may have a second conductivity type different from the first conductivity type. The first (Al,Ga)N layer may be doped n-type and the second (Al,Ga)N layer may be doped p-type.

The first substrate temperature may be within the range 850° C. to 1050° C. The second substrate temperature may be within the range 650° C. to 1000° C. The third substrate temperature may be within the range 850° C. to 1050° C.

A second aspect of the present invention provides a semiconductor layer structure grown by a method as defined above.

A third aspect of the present invention provides a semiconductor light-emitting device comprising a semiconductor layer structure grown by a method as defined above. The device may be a light-emitting diode.

BRIEF DESCRIPTION OF THE DRAWINGS

Preferred embodiments of the present invention will now be described by way of an illustrative example with reference to the accompanying figures in which.

BEST MODE FOR CARRYING OUT THE INVENTION

Figure 1:
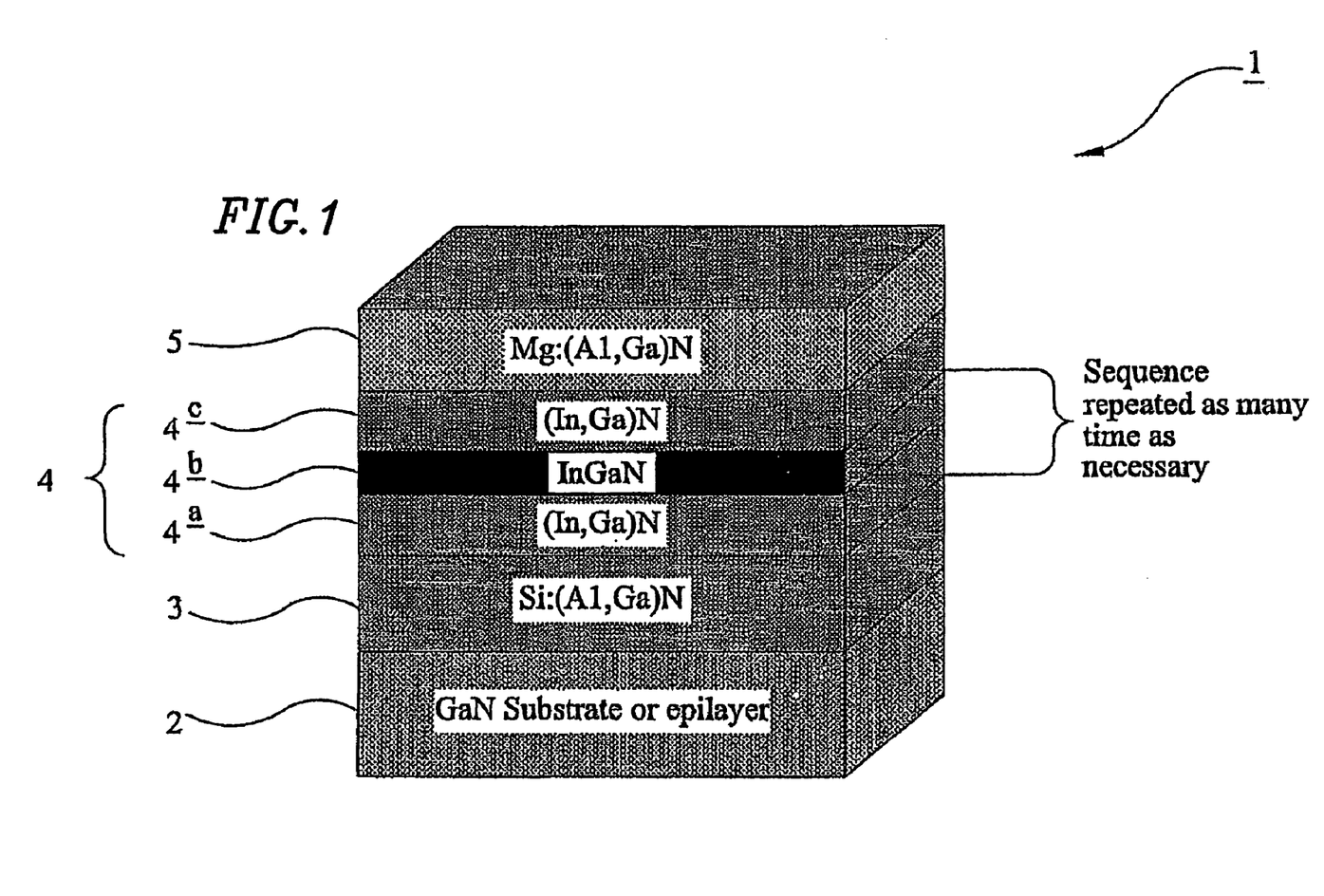
FIG. 1 is a schematic sectional view of a light-emitting diode incorporating an (In,Ga)N quantum well structure.

FIG. 1 is a schematic illustration of a semiconductor layer structure. FIG. 1 shows a light-emitting device, in this case a light-emitting diode or "LED", that emits light in the blue region of the spectrum. The LED 1 has a substrate 2. The substrate could be a bulk substrate of GaN or $Al_yGa_{1-y}N$ ($0 \leq y \leq 1$). The substrate could alternately consist of an epitaxial layer of GaN disposed on a base substrate of, for example, sapphire, SiC, Si, ZnO, or MgO.

The light emitting diode 1 of FIG. 1 further comprises a multiple quantum well structure 4 in which light is, in use, generated. The multiple quantum well structure 4 consists of a plurality of (In,Ga)N layers having at least two different indium mole fractions. In the structure shown in FIG. 1 the first (In,Ga)N layer 4a of the multiple quantum well structure 4 is a GaN layer or is an InGaN layer with a low indium mole fraction, preferably an indium mole fraction in the range from 0 to 0.05. The second (In,Ga)N layer 4b is an InGaN layer having a greater indium mole fraction than the first (In,Ga)N layer 4a, preferably within the range 0.05 to 0.2. The third (In,Ga)N layer 4c is a GaN layer, or an InGaN layer having a lower indium mole fraction than the second layer 4b. Preferably, the lower (In,Ga)N layer 4a and the upper (In,Ga)N layer 4c have approximately the same indium mole fraction as one another. (The lower (In,Ga)N layer 4a and the upper (In,Ga)N layer 4c may each have an indium mole fraction of zero, in which case they are both GaN layers.)

The multiple quantum well region 4 shown in FIG. 1 comprises three (In,Ga)N layers, but the multiple quantum well region 4 may consist of more than three layers if desired.

The multiple quantum well structure 4 is disposed between first and second (Al,Ga)N layers 3, 5. One or both of the (Al,Ga)N layers 3, 5 may be doped using a suitable impurity so as to display extrinsic conductivity. The two (Al,Ga)N layers 3, 5 are preferably doped so as to be of different conductivity types from one another. In the device shown in FIG. 1 the lower (Al,Ga)N layer 3 is doped to have n-type conductivity and the upper (Al,Ga)N layer is doped to have p-type conductivity but, in principle, the lower (Al,Ga)N layer 3 could be p-doped and the upper (Al,Ga)N layer 5 could be n-type doped.

As shown in FIG. 1, one example of a suitable n-type dopant is Si, and one example of a suitable p-type dopant is Mg, although other dopants may be used.

Figure 2:
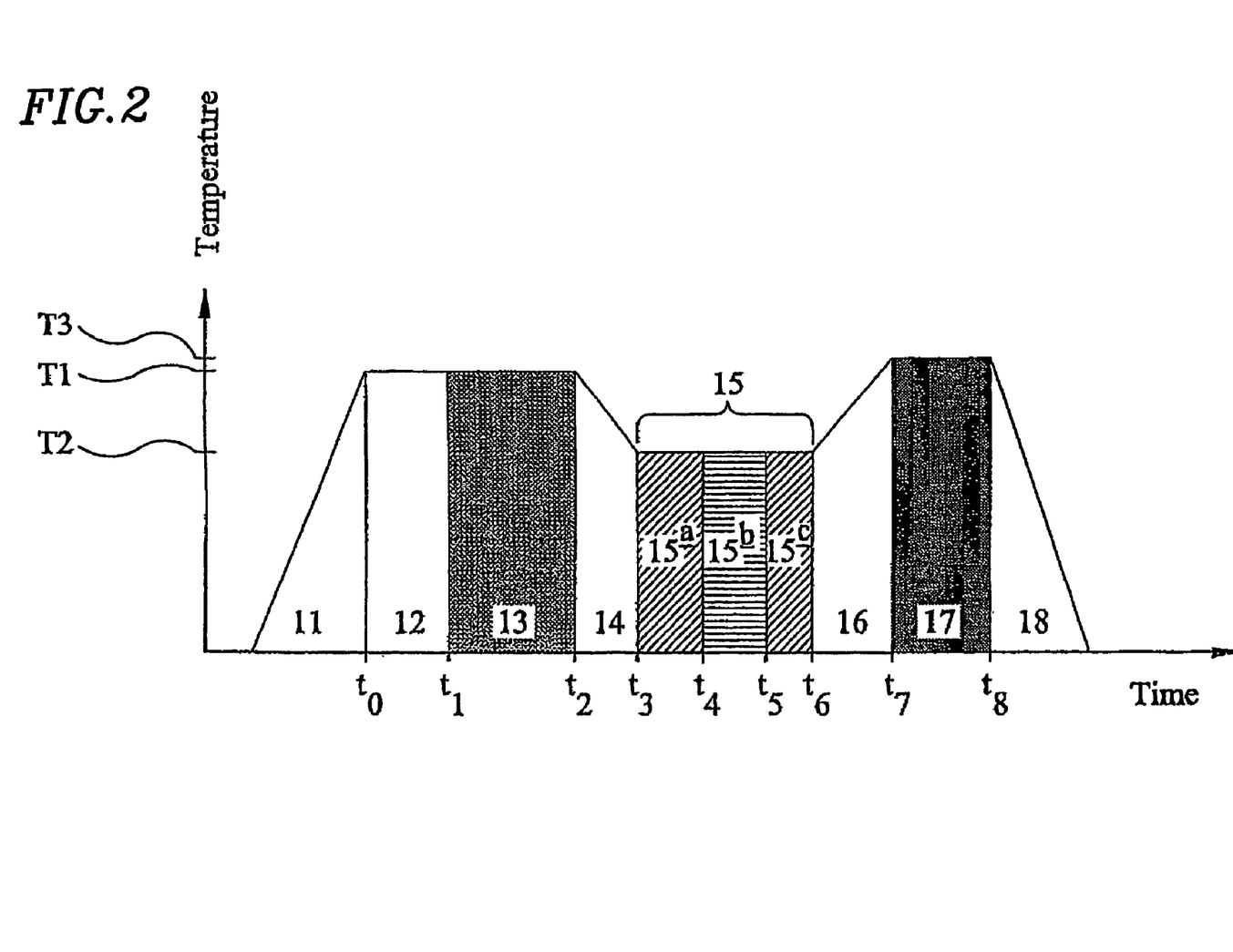
FIG. 2 illustrates the relation between substrate temperature and time for a growth method of the present invention.

FIG. 2 illustrates a growth method of the present invention as applied to the growth of a semiconductor layer structure, in this example to the growth of an LED having the general structure shown in FIG. 1. The invention provides a MBE growth method that uses ammonia as the source of nitrogen for the growth process.

According to the present invention, the first (Al,Ga)N layer is grown over the substrate by MBE using ammonia as a nitrogen precursor. This is step 13 in FIG. 2, and is carried out with the substrate at a first selected temperature. The substrate is then cooled to a second selected substrate temperature, which is suitable for the growth of the InGaN quantum well region 4. This is step 14 in FIG. 2. The (In,Ga)N multiple quantum well structure 4 is then grown at the new substrate temperature, again by MBE using ammonia as the nitrogen precursor. This is step 15 in FIG. 2, and steps 15a, 15b, and 15c correspond respectively to the growth of the layers 4a, 4b and 4c shown in FIG. 1. The supply of ammonia is maintained continuously during steps 13, 14 and 15, although the flow rate of ammonia may be varied between step 13 and step 14, or between step 14 and step 15.

A full description of the growth method of FIG. 2 will now be given.

Initially, a suitable substrate 2 is prepared and cleaned in any conventional manner, and is then introduced into the growth chamber of a suitable MBE apparatus. As mentioned above, the substrate 2 may be a bulk substrate of GaN or AlGaN, or it may consist of an epitaxial layer of GaN disposed on a base substrate.

At step 11 the substrate is heated to a pre-determined first substrate temperature T1. According to the present invention, this first substrate temperature is within the range 850° C.-1050° C.

GaN tends to decompose when it is heated to a temperature of around 800° C. or higher. This decomposition may be prevented by supplying an over-pressure of nitrogen gas or ammonia gas to the surface of the GaN. If the substrate 2 is a GaN substrate, or an epitaxial layer of GaN disposed on a base substrate, it is therefore preferable to supply ammonia gas to the growth chamber during step 11 of increasing the substrate temperature, in order to prevent thermal decomposition of the substrate. Since the subsequent growth steps will be carried out using ammonia as the nitrogen precursor, it is preferable if ammonia gas, rather than nitrogen gas, is supplied to the growth chamber during step 11. In principle, the ammonia gas does not need to be supplied at substrate temperatures substantially below 800° C., but it may be more convenient to supply ammonia gas for the entire duration of the heating step.

The rate at which the temperature of the substrate is increased to the desired first substrate temperature T1 in step 11 should not be so great that an uneven temperature distribution might occur in the substrate, since this would set up thermal stresses in the substrate. A temperature ramp rate in the range of 10-120° C. per minute has been found to be suitable.

Once the substrate has reached the first desired substrate temperature—which is the desired substrate temperature for the growth of the first (Al,Ga)N layer 3, the substrate is preferably maintained at this temperature for up to thirty minutes to bake the substrate and thereby remove contaminants from the substrate. This is step 12 of FIG. 2. The supply of ammonia gas to the growth chamber is maintained through step 12—indeed, the supply of ammonia gas to the growth chamber is maintained continuously throughout the growth of the layers of the LED 1.

At the end of the baking step (or, if there is no baking step, once the temperature of the substrate 2 has reached the desired first substrate temperature) the supply of gallium to the growth chamber is then started. This occurs at time $t_1$ in FIG. 2. If the (Al,Ga)N layer 3 has a non-zero aluminium mole fraction, the supply of aluminium to the growth chamber is also started at time $t_1$. Finally, the supply of a suitable dopant to the growth chamber may also be started at time $t_1$ if the layer 3 is desired to be a doped layer. For example, if the layer 3 is desired to be an n-type doped layer the supply of a suitable n-type dopant such as silicon to the growth chamber is started at time $t_1$. Thus, gallium and nitrogen, and possibly a dopant and/or aluminium, are now being supplied to the growth chamber and, as a result, the (Al,Ga)N layer 3 will now be grown by MBE on the substrate 2. Growth of the n-type (Al,Ga)N layer 3 is shown as step 13 in FIG. 2, and is maintained for the time required for the layer 3 to reach its desired thickness.

After a growth period corresponding to the time required for the layer 3 to grow to its desired thickness, the supply of gallium, and the supply of the dopant and/or aluminium if these were supplied during step 13, are stopped. This occurs at time $t_2$ in FIG. 2.

The preferred growth temperature for the (In,Ga)N multiple quantum well structure 4 is less than the preferred growth temperature for the (Al,Ga)N layer 3. Once the layer 3 has been grown, therefore, the substrate temperature is reduced to a second pre-determined value T2 that is suitable for the growth of the (In,Ga)N multiple quantum well structure 4. This is shown as step 14 in FIG. 2. As with step 1, the rate at which the temperature of the substrate is decreased to the desired second substrate temperature T2 should not be so great that an uneven temperature distribution might occur in the substrate. A temperature ramp rate in the range of 10-120° C. per minute has been found suitable for the cooling step.

Once the substrate temperature has reached its desired second value, the multiple quantum well structure 4 may then be grown. In order to do this, the supply of gallium to the growth chamber is turned on again at time $t_3$, to initiate the growth of the first (In,Ga)N layer 4a. If the layer 4a is a GaN layer it is sufficient to turn on the supply of gallium at time $t_3$—but if the layer 4a has a non-zero indium content it is also necessary to commence the supply of indium to the growth chamber at time $t_3$. Gallium and nitrogen, and possibly indium, are now being supplied to the growth chamber and the result is the epitaxial growth by MBE of a GaN or InGaN layer 4a over the first (Al,Ga)N layer 3. This is step 15a shown in FIG. 2. The duration of step 15a is chosen to allow the (In,Ga)N layer 4a to grow to its desired thickness. The indium flux during the growth of the first (In,Ga)N layer 4a is selected to obtain the desired indium mole fraction for the layer and, as noted above, if layer 4a is desired to be a GaN layer indium is not supplied to the growth chamber during step 15a.

Once the first (In,Ga)N layer 4a has grown to its desired thickness, the supply of indium to the growth chamber is increased, at time $t_4$. If the layer 4a is a GaN layer, the indium flux is turned on at time $t_4$, whereas if the layer 4a has a non-zero indium mole fraction then the indium flux is increased at time $t_4$ from a value appropriate for the indium mole fraction of the first layer 4a of the multiple quantum well structure to a value appropriate for the desired indium mole fraction of the second layer 4b of the multiple quantum well structure. The second (In,Ga)N layer 4b is then grown, and this is step 15b of FIG. 2. The duration of this step is chosen to allow the InGaN layer 4b to grow to its desired thickness.

Once the InGaN layer 4b has grown to its desired thickness, the supply of indium to the growth chamber is reduced at time $t_5$ to a value appropriate to the desired indium concentration of the third (In,Ga)N layer 4c. If the layer 4c is a GaN layer then the supply of indium is completely shut off at time $t_5$—however, if the layer 4c has an indium mole fraction that, while lower than the indium mole fraction of the layer 4b, is non-zero, then the indium supply rate is reduced but not stopped at time $t_5$. The third (In,Ga)N layer 4c is then grown, and the growth of this layer is step 15c in FIG. 2. Once the third (In,Ga)N layer 4c has reached its desired thickness, the supply of gallium, and also the supply of indium if the layer 4c has a non-zero indium mole fraction, are stopped. This occurs at time $t_6$ in FIG. 2.

The gallium flux is preferably held at a substantially constant value over the entire duration of the growth of the (In,Ga)N quantum well structure 4. The composition of the particular layer being grown is selected by varying the indium flux. In this embodiment, the indium flux may be simply varied between zero ("OFF") and a pre-set value ("ON") so that a sequence of alternating GaN and InGaN layers is grown. Alternatively, the indium flux may be simply varied between a low value and a higher value, so that a sequence of InGaN layers of alternating low and high indium concentrations is grown. Maintaining the gallium flux constant over the growth of the (In,Ga)N quantum well structure 4 has the advantage that the growth rate is also kept constant, since the growth rate of an (In,Ga)N layer is, at low rates of supply of indium, determined primarily by the rate of supply of gallium. Maintaining a substantially constant supply rate of gallium throughout the growth of the multiple quantum well structure 4 therefore ensures that each layer of the quantum well structure 4 is grown at the same growth rate, and this improves the growth quality of the quantum well structure 4.

As noted above in the description of FIG. 1, the multiple quantum well structure 4 may contain more than three (In, Ga)N layers. In this case, steps 15b and 15c are repeated as often as necessary to grow the desired multiple quantum well structure.

In the embodiment of FIG. 1, the substrate temperature is not intentionally varied during step 15, so that the (In,Ga)N layers 4a, 4b and 4c are grown at the same nominal substrate temperature. Growing the (In,Ga)N layers at the same nominal substrate temperature avoids the need to interrupt the growth process to heat or cool the substrate between growth of one (In,Ga)N layer and growth of the next (In,Ga)N layer.

It would alternatively be possible to vary the substrate temperature during the growth of the (In, Ga) N multi layer structure, so that growth of the In-rich layer(s) takes place at a different growth temperature than the growth of the In-poor layers. For example, the indium-poor layers may be grown in a temperature in the range 650° C. to 1,000° C., whereas the indium-rich layer (s) may be grown at a temperature within the range 650° C. to 800° C. This is because the quality of the indium-poor layers might be better at a higher substrate temperature, and because the incorporation of indium into an indium-poor layer is less critical so that a low growth temperature is not required.

Once the multiple quantum well structure 4 has been grown, the temperature of the substrate is then increased to a third pre-determined value T3, in preparation for the growth of the second (Al,Ga)N layer 5. This is step 16 in FIG. 2. As for the steps 11 and 14, the rate of change of the temperature of the substrate should not be so great that an uneven temperature distribution might occur in the substrate. A temperature ramp rate in the range of 10-120° C. has been found to be suitable.

The third desired substrate temperature T3, for the growth of the upper (Al,Ga)N layer 5, is preferably in the range of 850-1050° C. The third substrate temperature T3 is not required to be the same as the first substrate temperature T1, although T1 and T3 may be approximately equal to one another.

Once the substrate has reached the desired temperature T3 for the growth of the second (Al,Ga)N layer 5, the supply of gallium to the growth chamber is started, at time $t_7$. If the layer 5 has a non-zero aluminium mole fraction, the supply of aluminium to the growth chamber is also started at time $t_7$. Finally, the supply of a suitable dopant to the growth chamber may also be started at time $t_7$ if the (Al,Ga)N layer 5 is desired to be a doped layer. In the example of FIG. 1, in which the layer 5 is doped with magnesium, the supply of magnesium to the growth chamber is started at time $t_7$. Thus, gallium, and possibly a dopant and/or aluminium, are now being supplied to the growth chamber. As a result, a layer 5 of GaN or AlGaN will be grown by MBE over the multiple quantum well structure 4. This is step 17 in FIG. 2. Growth of the (Al,Ga)N layer 5 is maintained until the layer has reached a desired thickness.

After a growth period corresponding to the time required for the layer 5 to grow to its desired thickness, the supply of gallium, dopant (if present) and, in the case of an AlGaN layer, aluminium to the growth chamber is then shut off. This occurs at time $t_8$ in FIG. 2. The light emitting diode structure 1 shown in FIG. 1 is now complete.

Finally, in step 18, the substrate is cooled to room temperature. As for the other heating or cooling steps, the rate of change of the substrate temperature should not be so great that an uneven temperature distribution might occur in the substrate. A temperature ramp rate in the range of 10-120° C. per minute should again be suitable.

The supply of ammonia to the growth chamber is preferably maintained until the substrate temperature is substantially below 800° C., to prevent thermal decomposition of the (Al,Ga)N layer 5. The supply of ammonia to the growth chamber may be maintained for the entire duration of the cooling step 18 for convenience.

Ammonia gas is supplied to the growth chamber continuously during steps 12 to 17. Furthermore, ammonia is preferably supplied during the initial heating stage 11 and the final cooling stage 18, except perhaps for substrate temperatures significantly below 800° C. The ratio of the ammonia to the elemental metal supplied to the growth chamber is preferably in the range 10:1 to 10,000:1. This high V/III ratio allows the GaN and InGaN layers to be grown by MBE at temperatures well above those used in prior MBE growth methods, and this leads to improved material quality.

The beam equivalent pressure of ammonia gas is preferably in the range from $1\times10^{-4}$ to $2\times10^{-2}$ mbar. In steps 13 and 17 of growing the (Al,Ga)N layers 3, 5 the beam equivalent pressure of elemental gallium, or of elemental gallium and aluminium, is preferably within the range $1\times10^{-8}$ to $1\times10^{-4}$ mbar (where both elemental gallium and aluminium are supplied, the total beam equivalent pressure of the gallium and aluminium is preferably within this range).

In the growth of the (In,Ga)N layers 4a, 4b, 4c, the beam equivalent pressure of elemental gallium, or of elemental gallium and indium, is preferably within the range $1\times10^{-8}$ to $1\times10^{-4}$ mbar (again, where both elemental gallium and indium are supplied their total beam equivalent pressure is preferably within this range).

In an embodiment in which magnesium is used as the p-type dopant for the second (Al,Ga)N layer 5, the beam equivalent pressure of magnesium during step 17 is preferably within the range from $1\times10^{-9}$ to $1\times10^{-7}$ mbar.

In the embodiment described above the (In, Ga)N layers 4a, 4b, 4c of the multiple quantum well structure were not intentionally doped. It would alternatively be possible for one or more of these layers to be intentionally doped, for example to be doped n-type. These layers maybe doped n-type by supplying a suitable n-type dopant, for example such as silicon, to the growth chamber during step 15a, 15b and/or 15c, as appropriate.

Figure 3:
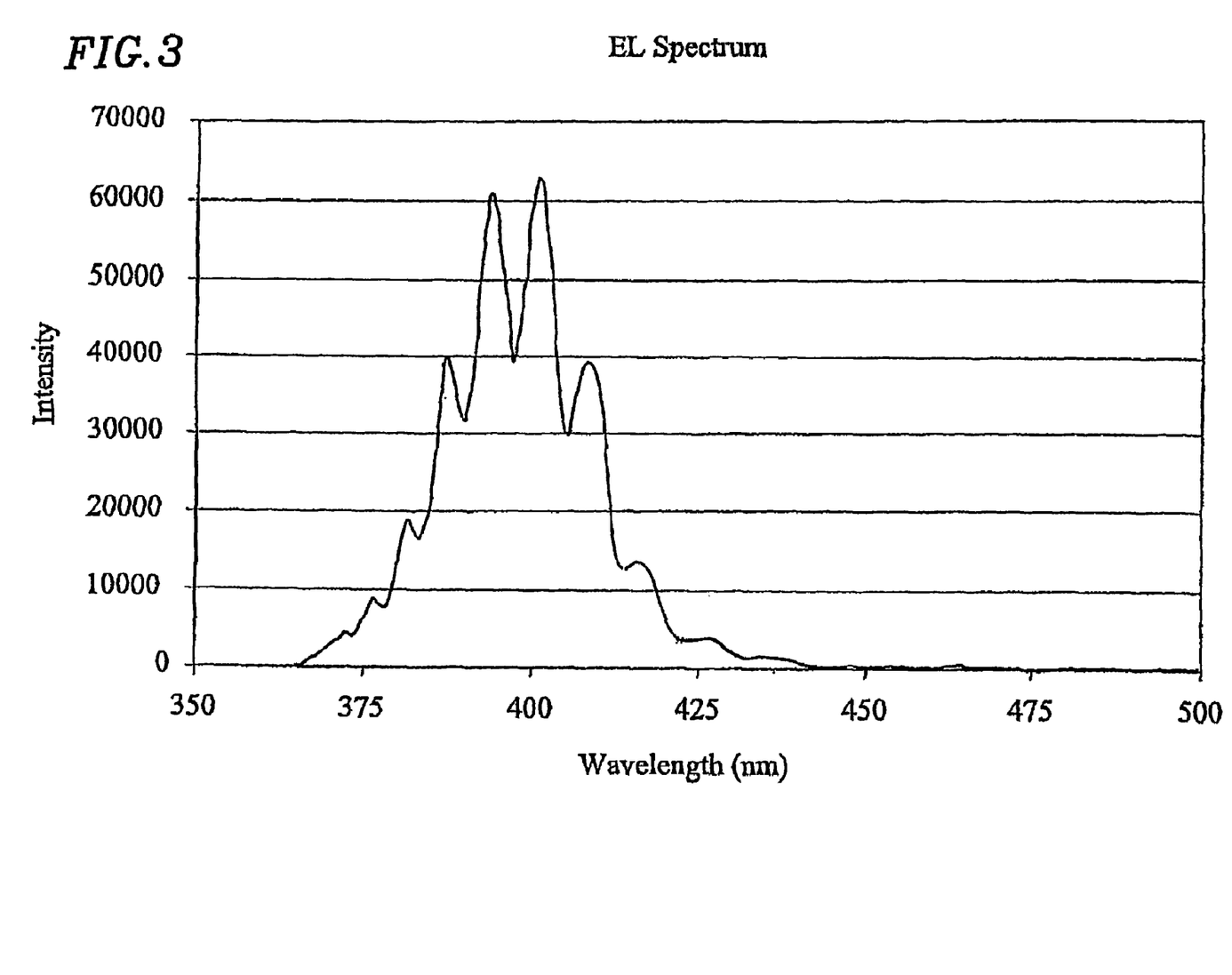
FIG. 3 illustrates the electro-luminescence spectrum for a LED grown according to a method of the present invention.

FIG. 3 shows an electro-luminescence spectrum of a light-emitting diode having the general structure shown in FIG. 1 grown by a MBE growth method of the present invention. It will be seen that the electro-luminescence spectrum has a well-defined peak centred on approximately 405 nm wavelength, and this is indicative of good crystal quality.

It should be noted that the use of MBE to grow the p-type doped (Al,Ga)N layer has the advantage that the layer has a good carrier concentration, and there is no need to anneal the dopant. Where such a layer is grown by MOVPE, it is necessary to anneal the layer to activate the dopant in order to maintain a satisfactory concentration.

The invention has been described above with reference to growth of an LED structure in which the (In,Ga)N quantum well structure comprises three adjacent (In,Ga)N layers. The invention is not limited to the growth of this particular structure, however, and maybe applied generally to the growth of a semiconductor layer structure having an (In,Ga)N quantum well structure, containing one or more (In,Ga)N layers, disposed between first and second (Al,Ga)N layers.

The present invention requires a MBE growth apparatus that can achieve a V/III ratio of more than 10:1 during the growth process, and that can preferably achieve a V/III ratio of more than 500:1 during the growth process. The use of a high V/III ratio during the growth process of the present invention allows an InGaN nitride semiconductor layer to be grown at temperatures well above those used in prior art MBE methods. This leads to improved material quality. The MBE growth process of the present invention requires at least one thousand times less ammonia gas than does a conventional MOVPE process.

Such high V/III ratios can be achieved, for example, in a MBE growth apparatus in which ammonia gas is introduced into the growth chamber through a conduit whose outlet end is placed as close to the substrate as possible without radiative heat from the substrate causing excessive local heating of the outlet of the supply conduit. The elemental gallium and elemental indium can be introduced into the growth chamber using a conventional effusion cell. Further effusion cells can be used to supply aluminium and/or an elemental dopant for incorporation into the epitaxial growth material as necessary.

Figure 4:
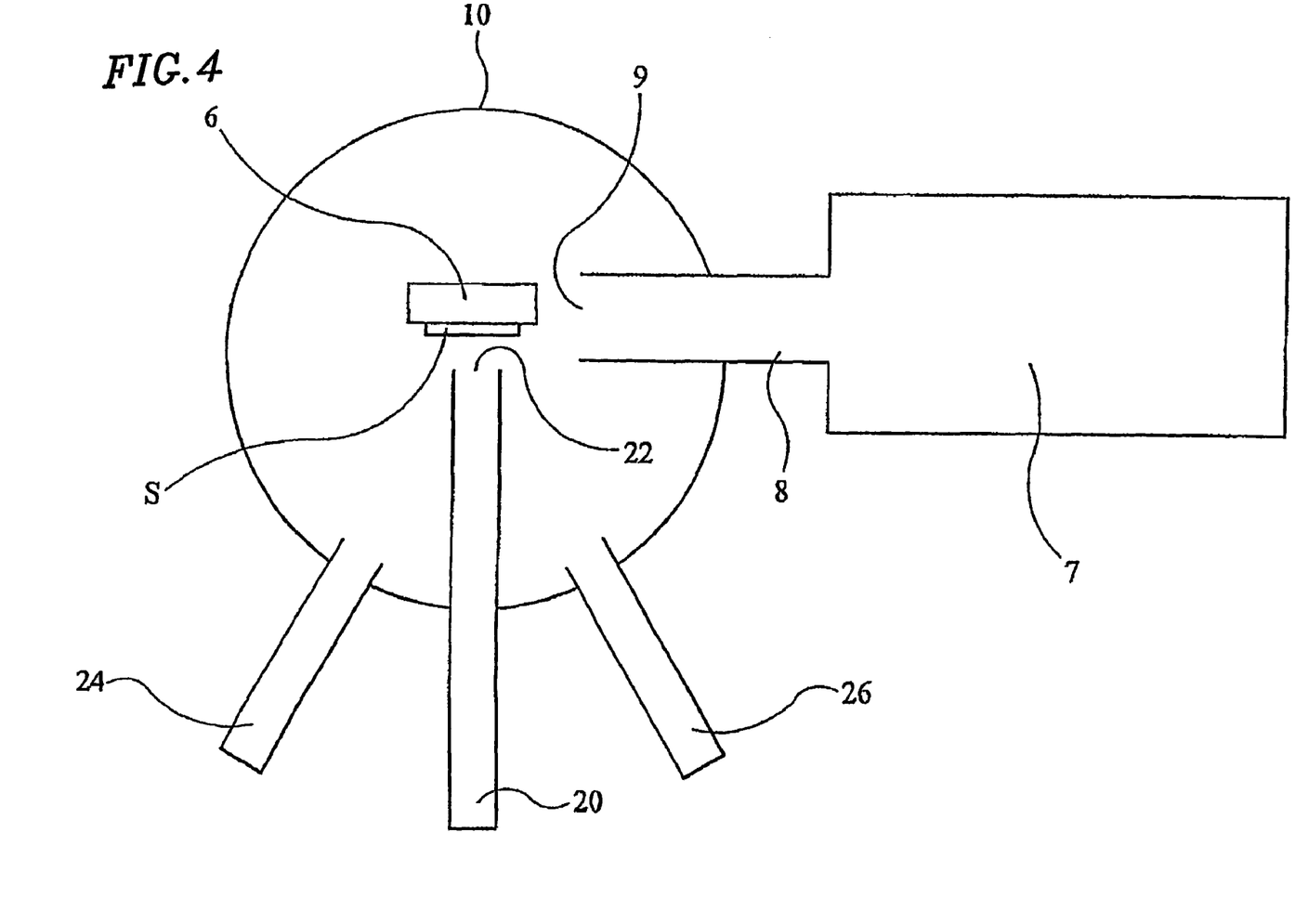
FIG. 4 is a schematic view of an MBE growth apparatus suitable for carrying out a method of the invention.

FIG. 4 is a schematic view of an apparatus suitable for the growth of a nitride semiconductor material by molecular beam epitaxy according to a method of the present invention. The apparatus comprises a growth chamber 10 in which is disposed a heated support 6 arranged to support and heat a substrate S. The growth chamber 10 is connected with an ultra-high vacuum pump 7 via an exhaust conduit 8 which extends into the growth chamber 10. The inner end of the exhaust conduit 8 defines a vacuum outlet 9 of the growth chamber 10. The vacuum outlet 9 is disposed adjacent to the substrate support 6.

The growth chamber 10 is further provided with a first supply conduit 20 which extends into the growth chamber so that an outlet 22 of the first supply conduit 20 is adjacent to and faces the surface of the substrate S upon which epitaxial growth is to take place. The first supply conduit 20 can be adjustably mounted relative to the chamber so that the relatively small distance between the outlet 22 of the first supply conduit 20 and the epitaxial growth surface of the substrate S can be varied during the epitaxial growth process. The longitudinal axis of the first supply conduit 20 is substantially perpendicular to the plane of epitaxial growth.

The first supply conduit 20 is used to supply ammonia which is the precursor of the nitrogen required in the epitaxial growth process. Because the outlet 22 of the first supply conduit 20 is positioned relatively close to the substrate S a relatively high ammonia vapour pressure is localised at the surface of the epitaxially growing material while still enabling an ultra-high vacuum environment within the growth chamber 10 to be achieved by the pump 7. The high ammonia vapour pressure enables a high V/III ratio to be realised during the growth process.

The apparatus further comprises independently operable, shutter-controlled effusion cells 24, 26 (two such cells are shown in FIG. 5) which contain sources of elemental gallium and for the epitaxial growth process. The effusion cells 24 and 26 are conventionally positioned and define second and further supply conduits respectively. Additional effusion cells may be provided to supply, for example, dopant species during the growth process.

A MBE apparatus of the type described above is described in European Patent Application No. 98301842.5, the contents of which are hereby incorporated by reference. It should be noted, however, that the present invention is not limited to a MBE apparatus of the type described in European Patent Application No. 98301842.5/0 864 672, but can be carried out in any MBE growth apparatus that can provide the required V/III ratio.

INDUSTRIAL APPLICABILITY

According to the present invention, high quality semiconductor layer structures comprising one or more $In_xGa_{1-x}N$ ($0 \leq x \leq 1$) layers can be grown by molecular beam epitaxy (MBE). The present invention achieves improved material quality over conventional MBE growth methods and requires at least one thousand times less ammonia gas than a conventional metal-organic vapour phase epitaxy growth. These semiconductor layer structures are suitable for use in light-emitting diodes and laser diodes, for example. The growth of these layer structures is therefore of considerable commercial importance.

The invention claimed is:

1. A method of growing a semiconductor layer structure, the method comprising the steps of:
    growing a first (Al,Ga)N layer over a substrate at a first substrate temperature within the range 850° C. to 1050° C. by MBE using ammonia as the nitrogen precursor;
    cooling the substrate to a second substrate temperature lower than the first substrate temperature within the range 650° C. to 1000° C., while maintaining the supply of ammonia to the substrate;
    growing an (In,Ga)N quantum well structure over the first (Al,Ga)N layer by MBE using ammonia as the nitrogen precursor;
    heating the substrate to a third substrate temperature higher than the second substrate temperature within the range 850° C. to 1050° C., while maintaining the supply of ammonia to the substrate; and
    growing a second (Al,Ga)N layer over the quantum well structure at the third substrate temperature by MBE using ammonia as the nitrogen precursor, wherein the ratio of the supplied ammonia to supplied elemental metal is within the range 10:1 to 10,000:1.

2. A method as claimed in claim 1 wherein the first (Al,Ga)N layer has a first conductivity type.

3. A method as claimed in claim 2 wherein the second (Al,Ga)N layer has a second conductivity type different from the first conductivity type.

4. A method as claimed in claim 3 wherein the first (Al,Ga)N layer is doped n-type and the second (Al,Ga)N layer is doped p-type.

* * * * *

UNITED STATES PATENT AND TRADEMARK OFFICE
CERTIFICATE OF CORRECTION

| | | |
|---|---|---|
| PATENT NO. | : 7,629,237 B2 | Page 1 of 1 |
| APPLICATION NO. | : 10/525499 | |
| DATED | : December 8, 2009 | |
| INVENTOR(S) | : Bousquet et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 581 days.

Signed and Sealed this

Second Day of November, 2010

David J. Kappos
*Director of the United States Patent and Trademark Office*